Sept. 9, 1969 T. E. SEIDEL 3,466,512

IMPACT AVALANCHE TRANSIT TIME DIODES WITH HETEROJUNCTION STRUCTURE

Filed May 29, 1967 2 Sheets-Sheet 1

INVENTOR
T. E. SEIDEL
BY [signature]
ATTORNEY

Sept. 9, 1969 T. E. SEIDEL 3,466,512
IMPACT AVALANCHE TRANSIT TIME DIODES WITH HETEROJUNCTION STRUCTURE
Filed May 29, 1967 2 Sheets-Sheet 2

United States Patent Office 3,466,512

Patented Sept. 9, 1969

3,466,512

IMPACT AVALANCHE TRANSIT TIME DIODES WITH HETEROJUNCTION STRUCTURE

Thomas E. Seidel, Berkeley Heights, N.J., assignor to Bell Telephone Laboratories, Incorporated, Berkeley Heights, N.J., a corporation of New York Filed May 29, 1967, Ser. No. 642,123
Int. Cl. H01l *11/00, 15/00*
U.S. Cl. 317—235 10 Claims

ABSTRACT OF THE DISCLOSURE

In order to obtain lower power loss in semiconductor diodes of the IMPact Avalanche Transit Time (IMPATT) type, a heterojunction structure is used in which the avalanche zone is made of a lower energy band gap seimiconductor material than the semiconductor material in the drift zone.

This invention relates to an improvement in high frequency negative dynamic resistance devices of the type disclosed in the patents of W. T. Read, Jr., No. 2,899,646; and B. C. DeLoach Jr., and R. L. Johnston, No. 3,270,-293; that is, those which utilize carrier transit time effects in semiconductors. Such devices are also known as IMPact Avalanche Transit Time (IMPATT) diodes.

In the aforementioned patents, negative dynamic resistance can be realized in a two terminal semiconductor device by suitable control over the structural and operating parameters of the device. The parameters are arranged so that the average effective transit time of charge carriers across the diode is properly related to the operating frequency. By such a control, the resulting integrated current-voltage product is negative at the operating frequency, resulting in power gain. This means that the diode will serve as a negative dynamic resistance at the operating frequency. For a given diode, thereby defining a frequency band over which power gain can be realized.

IMPATT diodes are characterized by an "avalanche region," including a P-N junction, and a "drift region," in a semiconductor device. In general, the avalanche region and the drift region may overlap. Due to this possible overlap, the concepts of avalanche region and drift region do not necessarily correspond to well-defined separate physical regions in the diode, but rather are functional concepts useful in understanding the operation of these devices.

Avalanching in the avalanche region creates charge carriers of two types, electrons and holes. This avalanching is produced whenever sufficient "reverse" electric field, called the "breakdown field," appears at the P-N junction in the avalanche region. By "reverse" electric field is meant an electric field at the P-N junction which is in a direction from the N-type conductivity zone to the P zone. Stated in another way, a reverse electric field is such that it tends to make the P zone of negative electric potential with respect to the N zone. Hence, any applied bias voltage which tends to make the P zone negative with respect to the N zone will tend to produce a reverse electric field, and is called a "reverse bias voltage."

The charge carriers, either of one or of both types, after generation in the avalanche region, drift through the rest of the diode, the drift region, under the influence of the electric field produced by the bias voltage. As a result of the avalanche and drift processes, a phase delay is introduced in the external current with respect to voltage. It is this phase delay which is responsible for power gain, or negative dynamic resistance.

However, power losses are attributable to the voltage drop across the avalanche region associated with the electric field therein, just as power gain is attributable to the voltage drop across the drift region. Thus, by minimizing the voltage drop across the avalanche region, but consistent with an electric field of sufficient strength to cause appropriate avalanche and drift, the overall power gain of the device may be improved.

A low energy band gap in semiconductor materials is associated with low electric field required for avalanche. Therefore, by choosing the semiconductor material of the avalanche region to be of lower energy band gap material than that of the drift space, higher efficiency can be realized.

The object of this invention is an IMPact Avalanche Transit Time (IMPATT) diode of improved efficiency, that is, improved negative dynamic resistance.

In accordance with this object, the physical region of the diode corresponding to the avalanche region is made of relatively low energy band gap semiconductor material as compared with the semiconductor material in the physical region corresponding to the drift region. The interface of the different semiconductor materials is called a "heterojunction," although it should be understood that such a junction need not comprise opposite conductivity type semiconductor materials on opposite sides of the junction. It should also be understood that, due to the physical overlap of the avalanche and drift regions in some types of IMPATT diodes, there arises some freedom in specifying the exact physical location of the heterojunction.

The foregoing, as well as the objects, features and advantages of this invention will be better understood from the following more detailed description with reference to the accompanying drawing, in which.

Figure 1:
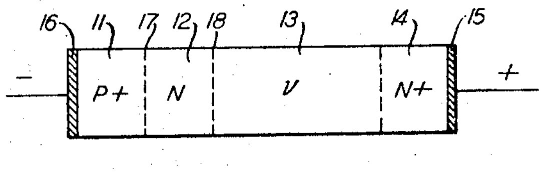
FIG. 1 (PRIOR ART)
FIG. 1 represents a Read diode with a $P^+N\nu N^+$ structure as in the prior art.

It may be noted that in the drawing, which is not to scale, zones of the semiconductor illustrated are designated by the letters $N^+$, $P^+$, N, P, $\nu$, or $\pi$, indicative of the conductivity type. The letters $\nu$ and $\pi$ designate zones of N and P type conductivity, respectively, but only where the net predominant impurity concentration is low, that is, below the order of $10^{15}$ impurities per cm.$^3$. $N^+$ and $P^+$ indicate strongly N and P type conductivity, respectively, where the predominant impurity concentration is high, that is, above the order of $10^{18}$ to $10^{20}$ impurities per cm.$^3$. N and P indicate intermediate or moderate conductivity.

In order to carry out this invention, it is necessary to choose a relatively high energy band gap (between the valance and conduction bands) semiconductor material and a relatively low energy band gap semiconductor material, and design the diode parameters with these chosen semiconductors. These parameters include the thicknesses of the various type zones of conductivity in the semiconductors and net impurity concentrations therein.

Examples of some suitable combinations of low energy band gap semiconductor material with high energy band gap semiconductor would be as given in Table I.

TABLE I

| | |
|---|---|
| Germanium | Silicon. |
| Germanium | Gallium arsenide. |
| Germanium | Gallium arsenide$_{(x)}$ phosphide$_{(1-x)}$. |
| Silicon | Gallium phosphide. |
| Gallium arsenide | Gallium phosphide. |
| Gallium arsenide | Gallium arsenide$_{(x)}$ phosphide$_{(1-x)}$. |
| Indium antimonide | Indium arsenide. |
| Indium antimonide | Aluminum antimonide. |
| Indium antimonide | Gallium antimonide. |
| Indium arsenide | Gallium arsenide. |
| Indium arsenide | Indium phosphide. |
| Gallium antimonide | Gallium arsenide. |
| Gallium antimonide | Aluminum antimonide. |
| Mercury$_{(x)}$ cadmium$_{(1-x)}$ telluride | Cadmium telluride. |
| Lead sulphide | Cadmium sulphide. |
| Lead selenide | Cadium selenide. |
| Lead telluride | Cadmium telluride. |
| Zinc sulphide | Cadmium sulphide. |
| Zinc telluride | Cadmium telluride. |
| Zinc selenide | Cadium selenide. |

The material in the left-hand column of Table I is the relatively low gap semiconductor material with respect to the corresponding material in the right-hand column. Additionally, the subscripts ($x$) and (1-$x$) refer to variable relative proportions of the components of the compound semiconductor involved, $x$ varying between 0 and 1. Also, the material in the left-hand column of Table I, in which the avalanche region is located in the diode, is called the "cathode" of the diode; while the material listed on the right-hand column is called the "anode," by analogy to vacuum tubes wherein the charge carriers are created at the cathode and are collected at the anode.

The above Table I illustrates some typical systems which are theoretically capable of advantageous use in this invention. However, it is generally desirable for optimum results that the heterojunction itself be relatively free from interface states, and so the choice of such systems will be dependent on the availability of suitable fabrication techniques.

Application of the invention to the Read-type structure

FIG. 1 represents a typical Read diode structure of the prior art. It should be understood that zones 11, 12, 13, 14 representing the $P^+$, N, $\nu$, $N^+$ conductivity type semiconductor crystal could as well be of $N^+$, P, $\pi$, $P^+$ conductivity type, respectively, provided the applied voltage bias to the metallic ohmic electrodes 15 and 16 be reversed from that indicated on the drawing by the + and − symbols. The P-N junction at 17 is located at the interface between the $P^+$ zone 11 and the N zone 12. The interface between the N zone 12 and the $\nu$ zone 13 is designated 18 in this FIG. 1.

Figure 1A:
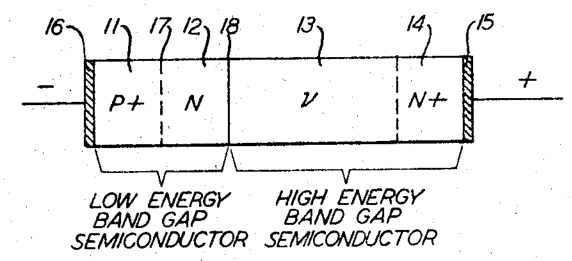
FIG. 1A represents a Read diode with a $P^+N\nu N^+$ structure including different semiconductor materials having differing energy band gaps, in accordance with this invention.

FIG. 1A represents the Read-type diode, as in FIG. 1 but now with the addition of the heterojunction at 18 defined by zones 11 and 12 being made of a semiconductor crystalline material with a lower energy band gap than zones 13 and 14, in accordance with this invention. Likewise, in FIG. 1A the substitution of $N^+P\pi P^+$ for the $P^+N\nu N^+$ structure shown could be performed, with a reversal of the bias voltage applied at the electrodes 15 and 16. Neither FIG. 1 nor FIG. 1A is to scale, but in both said figures the zone 13 is considerably wider than 12.

In order to understand the advantage of the use of different semiconductor materials of differing energy band gaps, that is, the advantage to the structure depicted in FIG. 1A over that of the prior art in FIG. 1, it is helpful to outline the theory of the efficiency of both these diodes in simplified operation. An oscillatory sinusoidal voltage is applied to either of these diodes in addition to the reverse bias voltage. This oscillatory voltage is made of such a magnitude that, when added to the bias voltage, it is sufficient to produce the breakdown electric field in the avalanche region including the P-N junction 17, but only for a small fraction of the cycle. Thus, a short pulse of charge carriers, electrons and holes, occurs in the neighborhood of the P-N junction 17. The electrons so created drift toward the electrode 15, but must first pass through the zone 13 of low conductivity caused by its low net impurity concentration. Thus, in drifting through zone 13, these electrons cause a time delay of current in the external circuit; because as they drift through zone 13, and until they reach zone 14 of high conductivity, they cause external current to flow. Power gain in the device is attributable to this pulse of electrons.

Figure 2:
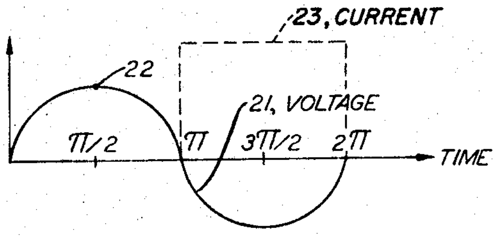
FIG. 2 represents a plot of voltage and current against time during idealized operation of the diodes shown in FIG. 1 or FIG. 1A.

In order to calculate this power gain, and contrast it in the structures shown in FIG. 1 as opposed to FIG. 1A, it should first be pointed out that the avalanche process itself produces a phase delay in the external current equal to $\pi/2$ radians (¼ cycle). In addition, it is instructive to do the calculation for an applied oscillatory sinusoidal voltage at the optimum frequency $f$ given by W. T. Read, (see U. S. Patent No. 2,899,646, column 7):

$$f=\frac{1}{2T} \qquad (1a)$$

or $$T=\frac{1}{2f} \qquad (1b)$$

where T=transit time of carriers across the drift region 13. In accordance with Equation 1$b$, and because of the delay of $\pi/2$ radians (¼ cycle) caused by the breakdown process itself, the external current due to the pulse of electrons flows continuously from a time corresponding to $\pi/2$ radians (¼ cycle) after breakdown until $3\pi/2$ radians (¾ cycle) after breakdown. Assuming the sinusoidally varying voltage begins at the time equal to zero, then the current flows from a time equal to ½ cycle thereafter until 1 cycle thereafter. FIG. 2 illustrates the voltage and current relation, in which the solid line 21 represents the oscillatory voltage which creates breakdown at point 22, and the dotted line 23 represents the external current. The power gain is attributable to the fact that the mathematically time-integrated product of the external current and voltage in FIG. 2 is negative. However, some of the applied voltage is dropped across the avalanche region in zones 11 and 12, in FIGS. 1 and 1A, especially in zone 12 where this voltage drop is much more serious.

This voltage drop across zone 12 causes a reduction in the efficiency, and hence a reduction in the power gain, of the diode. The reduction in efficiency is attributable to the fact that power is lost in this zone 12, such a way that the efficiency is reduced by a factor equal to the ratio of the voltage drop across zone 13 to the voltage drop across zones 12 plus 13. Hence, the ratio of the power gain of the heterojunction diode shown in FIG. 1A to the power gain of the diode of the prior art shown in FIG. 1 is equal to $$\frac{P_{\text{in FIG. 1A}}}{P_{\text{in FIG. 1}}}=\frac{V_{13\text{ in FIG. 1A}}}{V_{12+13\text{ in FIG. 1A}}}\div\frac{V_{13\text{ in FIG. 1}}}{V_{12+13\text{ in FIG. 1}}} \qquad (2)$$

where V represents the respective voltage drops and P represents the respective power gains.

In Equation 2, voltage drops in zones 11 and 14 are neglected as being very small due to relatively high conductivity. Thus, for given equal voltage drops across drift regions (zones 13, in FIGS. 1 and 1A) comprised of the same semiconductor materials, the powder gain for the device of FIG. 1A will be greater than that of the device of FIG. 1 because of the lower voltage drop across zone 12 in FIG. 1A as compared with FIG. 1. This lower voltgae drop across zone 12 in FIG. 1A is directly attributable to the lower energy band gap material in FIG. 1A, which in turn requires a lower voltage drop for avalanche. It should be noted that, by controlling the net impurity concentration in zone 12, the voltage drop in zone 12 is correspondingly controlled to the appropriate breakdown voltage.

Example.—Germanium-gallium arsenide heterojunction in Read diode structure

Figure 3:
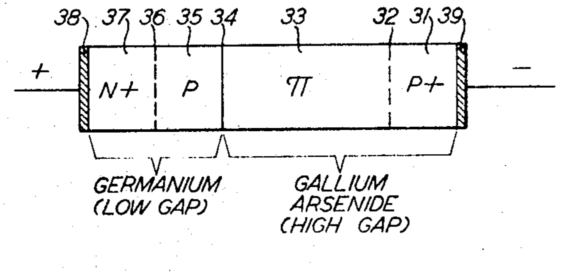
FIG. 3 represents a particular embodiment of a Read diode with an $N^+P\pi P^+$ structure including different semiconductor materials having different energy band gaps, in accordance with this invention.

A germanium-gallium arsenide structure depicted in FIG. 3 is selected because of the good match in the lattice constants, advantageous for epitaxial growth.

It should be noted that the power gain in Read diodes is attributable to the electron carriers created in a $$P^+N\nu N^+$$

as opposed to holes in an $N^+P\pi P^+$ structure. An $N^+P\pi P^+$ structure is advantageous because the known model for the band edges in equilibrium shows a discontinuity at the heterojunction of 0.5 volt in the conduction band as against 0.1 volt in the valence band, so that holes in the $N^+P\pi P^+$ structure do not lose as much kinetic energy traversing the heterojunction in the diode as would electrons in the $P^+N\nu N^+$ structure. The $N^+P\pi P^+$ structure as shown in FIG. 3 of course, relies on the drifting of holes through the device as the source of gain. Some criteria for design of a germanium-gallium arsenide Read diode to operate at a frequency, in accordance with Equation 1 above, of 24 gHz. will now be given for the diode depicted in FIG. 3.

A substrate 31 of heavily doped $P^+$ type conductivity, advantageously of the order of $10^{18}$ impurities per cm.$^3$ or more, is prepared of gallium arsenide by any of the methods well-known in the art. This terminal zone 31, at a portion 32 of its surface, serves as a good electrical contact for the drift zone 33, which is prepared advantageously by epitaxial growth of gallium arsenide onto the substrate 31. The net acceptor impurity concentration in the drift zone 33 is relatively low, typically about $10^{14}$ per cm.$^3$, and the thickness of this zone 33 is about 2.0 microns. This thickness is necessary for the 24 gHz. operation as explained below under Criteria for Zone 33. Thereafter the heterojunction at 34 is formed by epitaxial growth of the germanium layer comprised of zones 35 and 37 as is now known in the art; for example, as described by J. C. Marinace in 4 IBM Journal of Research and Development, pages 280–282 (July 1960) or by R. R. Moest and B. R. Shupp in 109 Journal of the Electrochemical Society, pages 1061–1065 (November 1962). Zone 35 of the germanium layer is immediately adjacent to heterojunction 34 and advantageously contains a net impurity concentration of $1.8\times10^{16}$ acceptor impurities per cm.$^3$ and is about 0.55 micron in thickness. The net concentration of impurities in zone 37 is equal to of the order of $10^{18}$ donors per cm.$^3$, forming thereby a P-N junction at the interface 36 between zones 35 and 37. The terminal zone 37 advantageously may be made of a thickness of the order of at least 1 micron or more, as desired, so that the electric field drops to zero somewhere in zone 37 whatever the electric field may be at the P-N junction 36, in accordance with the criteria set forth below. Layers of highly conductive material 38 and 39, typically of metal, are deposited onto terminal zones 31 and 37 in order to furnish facile connection to the external circuit.

In practice, it should be understood that the device in FIG. 3 is first fabricated in a relatively large cross-sectional area, typically of the order of one cm.$^2$, and thereafter it is cut into pieces of much smaller cross-section typically of the order of $10^{-3}$ cm.$^2$.

Criteria for Zone 33

It should be noted that the concentration of impurities in zone 33, the drift region, is not critical, but should be made sufficiently small so that the electric field does not fall from its value at the heterojunction 34 to a value below the "critical field" at the other end 32 of the drift region. That is to say, the field above which the velocity of carriers is substantially independent of field strength must be maintained throughout zone 32.

This falling-off in zone 33 of the electric field E in the $x$ direction (toward the right in FIG. 3) in a one dimensional case, as in the Read diode, is governed by $$\frac{dE}{dx}=Nq/\epsilon \qquad (3)$$

where

N=net concentration of ionized acceptor impurities, (donors are counted as negative)
$q$=electric charge of an electron,
$\epsilon$=dielectric constant of zone 33.

Since the electric field is sufficient to ionize (singly) substantially all the impurities in Equation 3, N may be taken to be the net acceptor impurity concentration, counting donors as negative. Thus, Equation 3 governs this fall-off of the electric field, and by mathematical integration across this zone 33:

$$E_{at\,32}-E_{at\,34}=\int_{34}^{32}(Nq/\epsilon)dx \qquad (4)$$

For a uniform acceptor impurity concentration N in zone 33.

$$E_{at32}-E_{at34}=(Nq/\epsilon)L_{33}$$
$$E_{at32}=E_{at34}+(Nq/\epsilon)L_{33} \qquad (5)$$

Where $L_{33}$ is the (positive) width of zone 33. It should be remembered that N and $\epsilon$ are positive but $q$ (electronic charge) is negative, so that $E_{at32}$ is less than $E_{at34}$, $E_{at34}$ being positive (due to the reverse bias voltage). Thus $E_{at32}$ is less than $E_{at34}$, but $E_{at32}$ must be kept above the "critical field," the electric field above which the velocity of carriers is independent of electric field strength. Thus, there is an upper limit for N, the net acceptor impurity concentration, in zone 33. In this zone 33, an advantageous net impurity concentration of $10^{14}$ per cm.$^3$, or less, insures the maintenance of sufficient electric field throughout. The thickness of zone 33 is made so as to satisfy the relation between frequency and transit time of carriers across this zone 33 given by Equation 1$b$ above. For gallium arsenide, assuming a uniform drift velocity of $10^7$ cm./sec. under electric fields above the "critical field," that is, the field above which this velocity is independent of field strength, it is found from Equation 1$b$ that at 24 gHz. the thickness $L_{33}$ of zone 33 is equal to:

$$L_{33}=10^7 \text{ cm./sec.}\div2\times24\times10^9\text{/sec.}=2 \text{ microns} \qquad (6)$$

Criteria for zone 35

The net impurity concentration in zone 35 is advantageously about $1.8\times10^{16}$ acceptors per cm.$^3$, although this concentration may be as low as $5\times10^{15}$ acceptors per cm.$^3$ or as high as $2\times10^{16}$ per cm.$^3$. It is advantageous not to use still higher impurity concentrations in zone 35 than $2\times10^{16}$ acceptors per cm.$^3$, in order to favor avalanche breakdown over tunnelling and internal field emission (Zener) processes, which make for lower efficiency in Read diodes. On the other hand, lower concentrations in zone 35 than about $5\times16^{15}$ per cm.$^3$ lead to higher voltage drops in this zone, thereby decreasing the efficiency of the device as follows from the discussion above in connection with Equation 2.

The interrelations in zone 35 between impurity concentration, electric fields, voltage drop, and width of this zone 35 may be seen from the following considerations. The specific embodiment using germanium as the semiconductor in zone 35, in conjunction with gallium arsenide in zone 33, is illustrative of the typical case. Again, Poisson's Equation 3 above governs the fall-off of the electric field from its breakdown value at the P-N junction 36 to its drift value at the heterojunction 34. Integrating the one-dimensional Poisson's Equation 3 over zone 35:

$$E_{at34}-E_{at36}=+\int_{36}^{34}(Nq/\epsilon)dx \qquad (7)$$

where now N and $\epsilon$ refer to zone 35.

For a uniform acceptor impurity concentration in zone 35:

$$E_{at34}-E_{at36}=(Nq/\epsilon)L_{35}$$

or (8)

$$E_{at36}=E_{at34}-(Nq/\epsilon)L_{35}$$

where $L_{35}$ is the width of zone 35. Again it should be remembered that $L_{35}$, N and $\epsilon$ are positive, but $q$ is negative, in Equation 8. However the required breakdown field, $E_{at36}$, itself depends upon the impurity concentration in a given semiconductor material. In fact, for germanium, Table II gives some typical values of the breakdown field at various acceptor impurity concentration levels.

Table II (germanium)

| Breakdown field, $10^5$ volts/cm. | Acceptor impurity concentration, $10^{14}$ per cm.$^3$ |
|---|---|
| 1.6 | 2 |
| 1.9 | 13 |
| 2.2 | 50 |
| 2.4 | 100 |
| 2.6 | 180 |
| 3.0 | 500 |

It is necessary that $E_{at34}$ be larger than the required "critical field" for gallium arsenide, say $1.5\times10^5$ volt/cm., when the breakdown field is reached at the P-N junction 36. Taking $\epsilon$ for germanium to be 16 times that of the vacuum, and $q$ (electronic charge) to be $1.6\times10^{-19}$ coulombs, it now follows from Equation 8 that the value of the width of zone 35 ($L_{35}$) is determined as given in Table III by setting: $E_{at34}=1.5\times10^{15}$ volt/cm. and $E_{at36}$ equal to its value given in Table II.

TABLE III

| Acceptor impurity concentration, $10^{14}$ per/cm.$^3$ | Width of zone **35**, microns |
|---|---|
| 2 | 5 |
| 13 | 2.3 |
| 50 | 1.4 |
| 100 | 0.8 |
| 180 | 0.55 |
| 500 | 0.28 |

Furthermore, the voltage drop across zone 35 is equal to the average electric field in zone 35 multiplied by the width of zone 35. In turn, the average electric field is equal to one-half the sum of $E_{at36}$ and $E_{at34}$, due to the linear relation of field vs. distance in zone 35, as can be seen from Equation 3 above, with N being constant in zone 35. Hence, at breakdown the voltage drop is equal to one-half the sum of the electric field given in Table II and the electric field of $1.5\times10^5$ volt/cm. at the heterojunction 34, multiplied by the width of zone 35 given in Table III.

Thus, the values in Table IV are obtained, which relates the impurity concentration in zone 35 to the voltage drop across zone 35.

TABLE IV

| Acceptor impurity, concentration in zone **35**, $10^{14}$ per/cm.$^3$ | Voltage drop across zone **35**, volts |
|---|---|
| 2 | 75 |
| 13 | 39 |
| 50 | 25 |
| 100 | 16 |
| 180 | 10 |
| 500 | 6 |

Thus, in order to keep the electric field in zone 35 high enough to favor avalanche breakdown over the other processes and still maintain a relatively low voltage across this zone 35 for better efficiency, it is advantageous to make the net acceptor impurity concentration in zone 35 in the range of $5\times15^{15}$ to $2\times10^{16}$ impurities per cm.$^3$, corresponding to a range of 1.4 microns to 0.5 micron, respectively, for the thickness of this zone 35.

Criteria for terminal zone 37

It is advantageous to make terminal zone 37 highly doped, to a net impurity concentration of about $10^{18}$ per cm.$^3$ or higher. In this way, the electric field strength, governed again by Equation 3 will drop to zero as desired within less than one micron. If the junction 36 could be made perfectly abrupt, that is, the net concentration of donors in zone 37 suddenly go to zero at the junction 36, then about one fortieth of a micron (assuming a breakdown field of about $2.5\times10^{15}$ volt per cm. for germanium at the junction 36) would suffice as the thickness of zone 37. Such abrupt junctions need not be made in this device, although they could be made so abrupt in the present state of the art. In any event, if the fabrication of an abrupt junction 36 is not desired, then zone 37 must be made somewhat thicker than one micron before the net impurity concentration reaches $10^{18}$ donors per cm.$^3$. Thereafter, the thickness beyond the point at which the $10^{18}$ donors per cm.$^3$ is reached need only be about one fortieth of a micron. In practice, typically zone 37 has a thickness of about one micron to ensure that the electric field drops to zero within this zone.

Criteria for terminal zone 31

In terminal zone 31, it is likewise desired that the electric field always drops to zero within this zone 31. Since the electric field in zone 33 at the junction 32 between zones 33 and 31 is smaller than the breakdown field at the P–N junction 36, zone 31 can theoretically be made even thinner than zone 37 for the same magnitude of impurity concentration. Advantageously, however, zone 31 is made to have a net impurity concentration of the order of $10^{18}$ acceptor per cm.$^3$ and of sufficient thickness to furnish a convenient substrate for epitaxial growth of zone 33, typically 4 mils thick.

Relative advantage of heterojunction Read structure

With the above criteria for a Read diode made of germanium and gallium arsenide, most of the voltage drop across the diode appears across zones 33 and 35. It is these zones which correspond, respectively, to zones 13 and 12 in either FIG. 1 or FIG. 1A, and which enter into the relative power gain comparison in Equation 2 above.

In order to understand the advantage of the heterojunction structure of the invention, FIG. 1A, over the prior art device, FIG. 1, it should be remembered from Equation 2 above that it is the voltage drops across the respective zones 12 and 13 which determine the relative power gain. These voltage drops, in turn, are equal to the width of the zone in question multiplied by the average electric field therein. Thus, from Equation 2 above, it is clear that high electric fields and widths of zone 13 together with low electric fields and widths of zone 12 are associated with higher power gains. These higher power gains can be achieved by the flexibility in choices of materials in the heterojunction structure, as may be understood from the following consideration.

The width of the drift region, corresponding to zone 13, is completely determined by the frequency of the diode and the choice of semiconductor material for this zone. (See, for example, Equation 6 above and its derivation.) But this choice of semiconductor likewise determines the average electric field in this drift region, namely somewhat above the "critical field." Hence, for given frequency and choice of semiconductor in the drift region, zone 13, the voltage drop across zone 13 is fixed.

In selecting a semiconductor material for the avalanche region, zone 12, it should be remembered from Table III, for example, that the width of this zone cannot be made arbitrarily small, but must be made sufficiently large to cause the electric field to drop from its avalanche value at the P–N junction 17 to its appropriate drift value at 18, the interface between zones 12 and 13. It is also true that in general, the avalanche breakdown field in a semiconductor is always lower in those semiconductors having a lower energy band gap. Thus, in the heterojunction structure, by selecting a semiconductor material for zone 12 which has a lower energy band gap than that of the semiconductor in zone 13, the average electric field in zone 12 is correspondingly lower than in the case where the same semiconductor material is used for zone 12 as for zone 13. Likewise, for a given impurity concentration in zone 12, the width of zone 12 can be made smaller in this heterojunction structure, because the electric field, governed by Poisson's Equation 3 above, does not need so much width to fall from its avalanche value at 17 to its drift value at 18. Thus, the voltage drop across zone 12 in the heterojunction structure of FIG. 1A can be made smaller than in the case of the same semi-conductor material throughout the diode depicted in FIG. 1, the prior art.

It should be noted that now having chosen the lower energy band gap semiconductor material for zone 12, it would not help to go back and also use this same low gap material for zone 13, for then the drift field in zone 13 would also be lower, thereby lowering the voltage drop across zone 13 and consequently lowering the power gain. This follows from the fact that there is a ratio of about three to one in the avalanche breakdown field to the drift field for all given semiconductors, in order to ensure no breakdown in the drift region, among other things.

Additionally, lower noise characteristic for the diode in FIG. 1A may be achieved by the selection of a semiconductor material for the avalanche zone 12 which has lower avalanche noise properties than the semiconductor material in the drift zone 13, in addition to a lower energy band gap in accordance with this invention.

Application of heterojunctions to IMPATT structure in general

Figure 4:
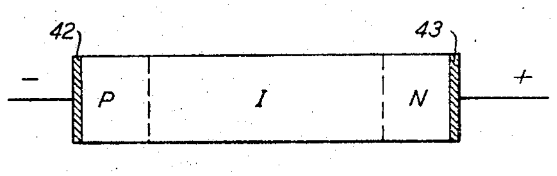
FIG. 4 (PRIOR ART)
FIG. 4 represents an IMPATT device with a PIN structure as in the prior art.

It is well-known that there are other IMPATT devices in addition to the Read structure of FIG. 1. FIG. 4 illustrates a P-I-N semiconductor structure useful for such devices, as shown for example in Patent No. 2,899,652 to W. T. Read. Here in FIG. 4, the letter I represents a zone of intrinsic type conductivity. In practice it is difficult to make precisely I-type semiconductor and to control the electric field therein; thus, this intervening zone of intrinsic conductivity in practice is only nearly intrinsic, that is, of very low uniform net impurity concentration of either donor or acceptor. Thus, in practice, this zone labelled I is either $\nu$ or $\pi$ type semiconductor, respectively.

Figure 4A:
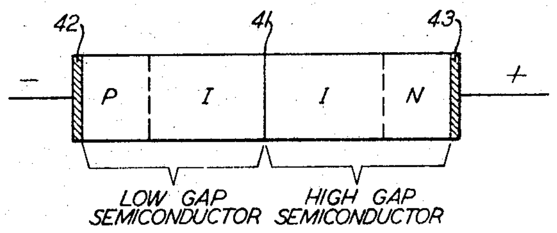
FIG. 4A represents an IMPATT device with a PIN structure including different semiconductor materials having different energy band gaps in accordance with this invention.

FIG. 4A shows the counterpart of FIG. 4 in accordance with the present invention, that is, with a heterojunction at 41. Reference numerals 42 and 43 in both FIG. 4 and FIG. 4A indicate the highly conductive material on a portion of the semiconductors' surfaces for external electrical contact as well as heat dissipation.

It should be understood that in practice the zones labelled I in FIG. 4A will either of uniform $\nu$ or $\pi$ type conductivity, for the same reason as in the prior art structure of FIG. 4.

Figure 5:
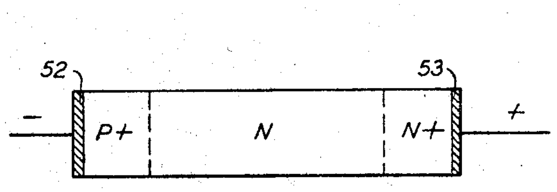
FIG. 5 (PRIOR ART)
FIG. 5 represents an IMPATT device with a $P^+NN^+$ structure as in the prior art.
Figure 5A:
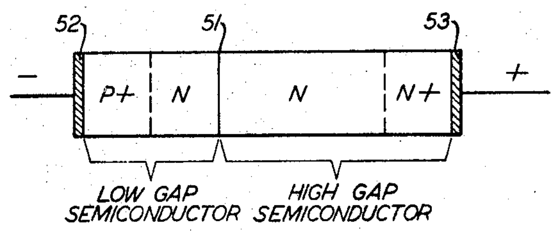
FIG. 5A represents an IMPATT device with a $P^+NN^+$ structure including different semiconductor materials having different energy band gaps, in accordance with this invention.

FIG. 5 illustrates a so-called P-N structure useful for another form of IMPATT devices, as known in the prior art and described in detail in U.S. Patent No. 3,270,293 to B. C. DeLoach, Jr., and R. L. Johnston. FIG. 5A shows the corresponding structure in accordance with the present invention, that is with a heterojunction as indicated at 51, between the high and low energy band gap semiconductor. Reference numerals 52 and 53 in both FIG. 5 and FIG. 5A indicate the highly conductive layers for good external electrical contacts and heat dissipation. It should be understood that P-type material may be substituted for the intervening zones labelled N in both FIGS. 5 and 5A. Also, FIGS. 4 and 5 represent extreme cases of overall relatively low and high net impurity concentrations, respectively, and therefore many intermediate combinations are possible by variation of the impurity concentrations. For example, a $P^+IN^+$ or $P^+IN$ structure would be such a combination.

Both FIGS. 4A and 5A represent structures with the advantage of greater efficiency than that of the corresponding FIGS. 4 and 5, respectively.

It should be understood that although the fabrication of the specific embodiment has been given in terms of epitaxial growth, any method, including diffusion of impurities into semiconductors, of preparing the appropriately impurity doped semiconductor structures is within the broadest aspect of this invention. Additionally, although the specific embodiment has been described in terms of a germanium-gallium arsenide semiconductor heterojunction; any choice of low and high energy band gap semiconductor materials, whether listed in Table I or not, is within the broadest aspect of this invention. Likewise, wide variations of the parameters of thickness of the zones and impurity concentrations therein are possible, as is obvious to those skilled in the art.

What is claimed is:

1. A semiconductor device of the impact avalanche transit time type including an anode and a cathode, in which the cathode is made of a semiconductor material having a lower energy band gap than the anode, the thickness of the anode being sufficient for the device to exhibit a negative dynamic resistance when avalanche is produced by an applied electric field to the device.

2. A semiconductor device in accordance with claim 1 in which the cathode is made of germanium and the anode is made of gallium arsenide.

3. A semiconductor device of the impact avalanche transit time type with a Read structure which comprises four semiconductor zones of impurity type conductivity, first and second semiconductor terminal zones of opposite impurity conductivity type both with high net impurity concentrations, and third and fourth intervening semiconductor zones of moderate and nearly intrinsic conductivity respectively of the same type as, and in physical contact with, each other; the first zone being of opposite conductivity from the third and fourth zones; the nearly intrinsic fourth zone being in physical contact with the second zone of the same type conductivity; the moderate conductivity third zone being in physical contact with the first zone of opposite conductivity type from the third zone, thereby forming a P-N junction with said first zone of opposite conductivity; and the first and third zones forming the said P-N junction being made of a semiconductor material having a lower energy band gap than the other semiconductor material including the second and fourth zones.

4. A semiconductor device in accordance with claim 3 in which the semiconductor material having the lower energy band gap is germanium and the other semiconductor material is gallium arsenide, the germanium thereby including the P-N junction.

5. A semiconductor device in accordance with claim 4 in which the first zone has a high net donor impurity concentration, the second zone has a high net acceptor impurity concentration, the third zone is of moderately P-type conductivity, and the fourth zone is of nearly intrinsic $\pi$-type conductivity.

6. A semiconductor device in accordance with claim 4 in which a portion of the surface of both the first and second terminal zones is covered with a highly electrically conductive material.

7. A semiconductor device of the impact avalanche transit time type which comprises two terminal semiconductor zones of opposite conductivity type and an intervening zone of nearly intrinsic conductivity in physical contact with both terminal zones and thereby physically separating said terminal zones, in which one of the said terminal zones together with a portion of the intervening intrinsic zone is made of a lower energy band gap semiconductor material than that of the semiconductor material which contains the other terminal zone and the remaining portion of the intervening nearly intrinsic zone.

8. A semiconductor device in accordance with claim 7 in which a portion of the surface of both the terminal zones is covered with a highly electrically conductive material.

9. A semiconductor device of the impact avalanche transit time type which comprises two terminal zones of opposite conductivity type in a semiconductor, both said zones being of high electrical conductivity type semiconductor, and an intervening zone of moderate conductivity type semiconductor in physical contact with both said terminal zones thereby physically separating said terminal zones, in which one of the said terminal zones together with a portion of the intervening zone is made of a lower energy band gap semiconductor than the semiconductor containing the other terminal zone together with the remaining portion of the intervening zone.

10. A semiconductor device in accordance with claim 9 in which a portion of the surfaces of both terminal zones is covered with a highly electrically conductive material.

References Cited

UNITED STATES PATENTS

| | | | |
|---|---|---|---|
| 2,899,646 | 8/1959 | Read | 331—96 |
| 3,363,155 | 1/1968 | Newman | 317—235 |
| 3,072,507 | 1/1963 | Anderson | 148—33 |
| 2,908,871 | 10/1959 | McKay | 331—108 |

JOHN W. HUCKERT, Primary Examiner

M. EDLOW, Assistant Examiner

U.S. Cl. X.R.

307—283; 317—234